United States Patent
Zeng et al.

(10) Patent No.: US 10,950,671 B2
(45) Date of Patent: Mar. 16, 2021

(54) FLEXIBLE TOUCH PANEL, METHOD FOR MANUFACTURING THE SAME AND FLEXIBLE TOUCH DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Ting Zeng, Beijing (CN); Qicheng Chen, Beijing (CN); Hui Chen, Beijing (CN); Shichao Fei, Beijing (CN); Yangjie Li, Beijing (CN); Wanru Dong, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/502,316

(22) Filed: Jul. 3, 2019

(65) Prior Publication Data
US 2020/0013831 A1    Jan. 9, 2020

(30) Foreign Application Priority Data
Jul. 3, 2018    (CN) .......................... 201810719645.9

(51) Int. Cl.
G06F 3/041 (2006.01)
H01L 27/32 (2006.01)
H01L 51/00 (2006.01)

(52) U.S. Cl.
CPC ............ *H01L 27/323* (2013.01); *G06F 3/041* (2013.01); *H01L 27/3276* (2013.01); *H01L 51/0023* (2013.01); *H01L 51/0097* (2013.01); *G06F 2203/04102* (2013.01); *H01L 2251/5338* (2013.01)

(58) Field of Classification Search
CPC . G06F 2203/04102; G06F 2203/04103; G06F 3/041; H01L 2251/5338; H01L 27/323; H01L 27/3276; H01L 51/0023; H01L 51/0097
See application file for complete search history.

(56) References Cited

U.S. PATENT DOCUMENTS

| | | | |
|---|---|---|---|
| 8,048,512 B2* | 11/2011 | Nashiki | B32B 7/02 257/431 |
| 2007/0164967 A1* | 7/2007 | Osame | G09G 3/3233 345/98 |
| 2014/0313436 A1* | 10/2014 | Wu | G02F 1/133516 349/12 |
| 2016/0170540 A1* | 6/2016 | Yang | G02B 1/14 345/173 |
| 2017/0179424 A1* | 6/2017 | Lee | H01L 51/0097 |

FOREIGN PATENT DOCUMENTS

WO    WO-2013118314 A1 *    8/2013    ............. G06F 3/044

* cited by examiner

*Primary Examiner* — Ram A Mistry
(74) *Attorney, Agent, or Firm* — Brooks Kushman P.C.

(57) ABSTRACT

A method for manufacturing a flexible touch panel, a flexible touch panel and a flexible touch device are provided. The method for manufacturing the flexible touch panel includes: forming a first indium tin oxide (ITO) film layer on a flexible base layer attached to a transparent substrate via an optical adhesive layer; and patterning the first ITO film layer to form a touch electrode of the flexible touch panel.

18 Claims, 8 Drawing Sheets

FLEXIBLE TOUCH PANEL, METHOD FOR MANUFACTURING THE SAME AND FLEXIBLE TOUCH DEVICE

CROSS-REFERENCE TO RELATED APPLICATION

This application claims priority to Chinese Patent Application No. 201810719645.9 filed on Jul. 3, 2018, which is incorporated herein by reference in its entirety.

TECHNICAL FIELD

The present disclosure relates to the field of touch control technologies, in particular to a flexible touch panel, a method for manufacturing a flexible touch panel and a flexible touch device.

BACKGROUND

With the development of display technologies, flexible display technology has gradually become a popular application in electronic display. A flexible touch panel from the flexible display technology has been widely applied in various products in the field of flexible display.

A sensor of the flexible touch panel usually includes a metal mesh flexible electrode and an Indium Tin Oxide (ITO) flexible electrode. Due to the defects of product yield, moire and transmittance of the metal mesh flexible electrode, the ITO flexible electrode will occupy a market share for a long time.

SUMMARY

Some embodiments of the present disclosure provide a method for manufacturing a flexible touch panel, and the method includes:

forming a first indium tin oxide (ITO) film layer on a flexible base layer attached to a transparent substrate via an optical adhesive layer; and patterning the first ITO film layer to form a touch electrode of the flexible touch panel.

In some embodiments of the present disclosure, before the forming a first indium tin oxide film layer on a flexible base layer, the method for manufacturing the flexible touch panel described above further includes:

sequentially attaching the optical adhesive layer and the flexible base layer to the transparent substrate, where a border of the optical adhesive layer extends beyond an edge of the flexible base layer.

In some embodiments of the present disclosure, after the sequentially attaching the optical adhesive layer and the flexible base layer to the transparent substrate, where a border of the optical adhesive layer extends beyond an edge of the flexible base layer, the method for manufacturing the flexible touch panel described above further includes:

performing an annealing process on the transparent substrate, the optical adhesive layer and the flexible base layer.

In some embodiments of the present disclosure, in the method for manufacturing the flexible touch panel described above, the patterning the first ITO film layer includes:

performing a glue coating process, an exposure process, a development process and an etching process on the first ITO film layer, where a periphery of the first ITO film layer is shielded by a shutter of an exposure machine during the exposure process, so that an ITO film of the first ITO film layer covering a periphery of the flexible base layer is retained after the etching process.

In some embodiments of the present disclosure, after forming the touch electrode of the flexible touch panel, the method for manufacturing the flexible touch panel described above further includes:

forming a metal trace in a non-touch area of the flexible touch panel;

forming an organic insulating layer on the touch electrode and the metal trace, and forming a via hole in the organic insulating layer through a patterning process; and forming a second ITO film layer on the organic insulating layer, and patterning the second ITO film layer to form a bridge for the touch electrode.

In some embodiments of the present disclosure, in the method for manufacturing the flexible touch panel described above, the patterning the second ITO film layer includes:

performing a glue coating process, an exposure process, a development process and an etching process on the second ITO film layer, where the shutter of the exposure machine is arranged away from the periphery of the flexible base layer during the exposure process, so that the ITO film covering the periphery of the flexible base layer is removed during the etching process In some embodiments of the present disclosure, in the method for manufacturing the flexible touch panel described above, a thickness of the first ITO film layer is greater than a film thickness threshold, the film thickness threshold is a lowest thickness corresponding to a target in-plane ITO sheet resistance of the flexible touch panel, and the target in-plane ITO sheet resistance is greater than or equal to 30 ohms per square and less than or equal to 40 ohms per square.

In some embodiments of the present disclosure, in the method for manufacturing the flexible touch panel described above, the flexible base layer comprises a flexible film, a hard coating layer, and an index margin layer.

In some embodiments of the present disclosure, in the method for manufacturing the flexible touch panel described above, a temperature for the annealing process is greater than or equal to 130 degree Celsius and less than or equal to 140 degree Celsius.

In some embodiments of the present disclosure, in the method for manufacturing the flexible touch panel described above, a thickness of the first ITO film layer is greater than or equal to 1200 angstroms and less than or equal to 1500 angstroms.

In some embodiments of the present disclosure, in the method for manufacturing the flexible touch panel described above, an indium-tin ratio of a target material for forming the first ITO film layer is 90:10.

In some embodiments of the present disclosure, in the method for manufacturing the flexible touch panel described above, the border of the optical adhesive layer extends beyond the edge of the flexible base layer by 1 millimeter to 2 millimeters, inclusively.

Some embodiments of the present disclosure further provide a flexible touch panel, which is manufactured with the method for manufacturing the flexible touch panel as described above, and the flexible touch panel includes a transparent substrate, an optical adhesive layer and a flexible base layer sequentially arranged on a side of the transparent substrate, and a touch electrode arranged on a side of the flexible base layer away from the transparent substrate;

where the touch electrode is an indium tin oxide (ITO) film layer, and the flexible base layer is attached to the transparent substrate via the optical adhesive layer.

In some embodiments of the present disclosure, in the flexible touch panel described above, a thickness of the ITO film layer is greater than a film thickness threshold, the film thickness threshold is a lowest thickness corresponding to a target in-plane ITO sheet resistance of the flexible touch panel, and the target in-plane ITO sheet resistance is greater than or equal to 30 ohms per square and less than or equal to 40 ohms per square.

In some embodiments of the present disclosure, in the flexible touch panel described above, a border of the optical glue adhesive layer extends beyond an edge of the flexible base layer by 1 millimeter to 2 millimeters, inclusively.

In some embodiments of the present disclosure, in the flexible touch panel described above, a thickness of the ITO film layer is greater than or equal to 1200 angstroms and less than or equal to 1500 angstroms.

In some embodiments of the present disclosure, in the flexible touch panel described above, the flexible touch panel further includes: an organic insulating layer arranged on a side of the touch electrode away from the flexible base layer, and an ITO bridge for connecting the touch electrode.

In some embodiments of the present disclosure, in the flexible touch panel described above, a side of the transparent substrate to which the optical adhesive layer and the flexible base layer are not attached is a touch operation surface.

In some embodiments of the present disclosure, in the flexible touch panel described above, the flexible base layer includes a flexible film, a hard coating layer, and an index margin layer.

Some embodiments of the present disclosure further provide a flexible touch device, including the flexible touch panel as described above.

BRIEF DESCRIPTION OF THE DRAWINGS

The accompanying drawings are used to provide a further understanding of technical solutions of the present disclosure and form a part of the specification. The accompanying drawings together with the embodiments of the present disclosure are merely intended to explain the technical solutions of the present disclosure, and do not intend to limit the technical solutions of the present disclosure.

DETAILED DESCRIPTION

Figure 1:
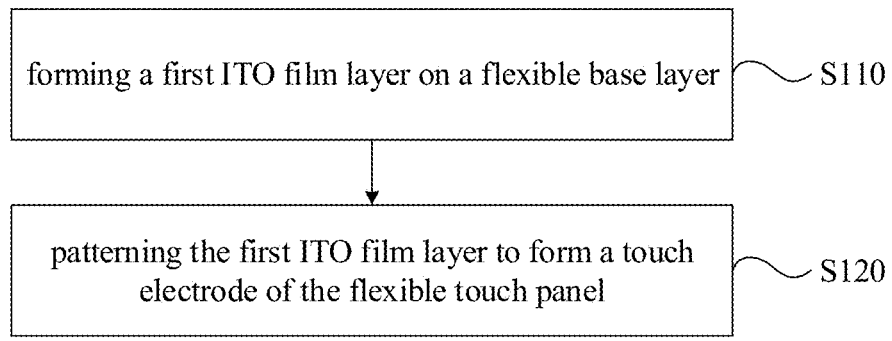
FIG. 1 is a flowchart of a method for manufacturing a flexible touch panel according to some embodiments of the present disclosure.

In order to make objects, technical solutions and advantages of the present disclosure clearer, embodiments of the present disclosure will be described in detail hereafter with reference to the accompanying drawings. It should be noted that the embodiments of the present disclosure and features in the embodiments can be combined with each other arbitrarily when no conflict occurs.

Steps shown in flowcharts of the drawings may be performed in a computer system including a set of computer executable instructions. Further, although a logical sequence is shown in the flowcharts, in some cases the steps may be performed in a sequence different from that described herein.

The embodiments of the present disclosure can be combined with each other, and the same or similar concepts or processes may not be repeated in some embodiments.

Due to flexible performance of organic electroluminance display (OLED) devices, OLED devices have gradually become popular products in electronic display currently. OLED device have been applied in mobiles. At present, OLED products have been promoted in mobiles such as S6/S7/S8 of Samsung, R9 of OPPO and the like.

As already explained in the background above, ITO flexible electrodes will occupy a market share of flexible touch panels for a long time. A display principle of the OLED device is a self-luminous technology, i.e. electron-hole filling leads electron level transition so as to emit light. Due to the improvement of user experience requirements, higher requirements are put forward for OLED products. First, full-screen mobile phones put forward the technical requirements of narrow borders or even no borders for the flexible touch panels. Narrow borders need to match lower in-plane ITO sheet resistance to ensure driving of integrated circuit (IC). Secondly, in order to reduce a light-emitting power consumption of OLED devices distributed on ITO electrodes, a lower in-plane ITO sheet resistance is also required.

Based on the design specification matching a narrow border requirement, the in-plane ITO sheet resistance is required to be in a range of 30 ohms per square to 40 ohms per square (Ω/□) to meet IC requirements. Otherwise, the resistance capacitance delay (RC Delay) of the circuit formed by resistance and capacitance will be prolonged, affecting charging time and a touch sensitivity of mobile phones. Therefore, touch sensitivity of the IC and power consumption is required to achieve requirements with a new technology. In addition, with the gradual promotion of border-less products, a space for arranging the touch electrode will be further reduced, which requires a lower channel impedance in the touch area to be realized by the manufacturing process of the touch electrode, i.e. to reduce in-plane sheet resistance, which requires a low-temperature ITO on Film process to be realized, and the implementation manner may be increasing the ITO thickness to meet the required electrical requirements.

At present, the ITO sheet resistance commonly used in the industry is 100 ohms per square. In order to meet the new technical requirements, i.e. to achieving a metal trace with specification lower than pitch (a sum of a line width and a seam) of 20 μm, the ITO sheet resistance of the flexible touch panel is required to be reduced from 100 ohms per square to a range of 30 ohms per square to 40 ohms per square.

In related technologies, the ITO coating is performed by adopting a roll to roll coating process (Roll to Roll, refers to roll transfer and performing roll processing on roll material) for performing a roll to roll coating of ITO film layer on a flexible film. Due to the limitation of process equipment and factors such as ITO crack easily generated during roll winding after roll to roll coating, the lowest in-plane sheet resistance can be realized is 70 ohms per square, which is difficult to meet the requirements of narrow-border flexible touch panel for lower sheet resistance.

The embodiments of the present disclosure provides a method for manufacturing a flexible touch panel, a flexible touch panel and a flexible touch device, addressing a requirement of narrow-border and border-less display products on a lower in-plane sheet resistance of a touch panel.

FIG. 1 is a flowchart of a method for manufacturing a flexible touch panel according to some embodiments of the present disclosure. The manufacturing method provided by the embodiments can be applied to manufacturing a flexible touch panel, and the flexible touch panel may be applied to narrow-borders or border-less display devices. The method for manufacturing the flexible touch panel according to the embodiments may include steps S110 to S120.

In step S110, a first ITO film layer is formed on a flexible base layer attached to a transparent substrate via an optical adhesive layer. The transparent substrate may be a glass substrate, for example.

In step S120, the first ITO film layer is patterned to form a touch electrode of the flexible touch panel.

In the method for manufacturing the flexible touch panel according to embodiments of the present disclosure, the main process is forming the touch electrode in the touch panel, i.e., forming an ITO film layer (namely, the first ITO film layer). In the related technologies, ITO coating is performed on a film with a roll to roll process. In the embodiments of the present disclosure, a roll to sheet process is used, an ITO coating process is not performed on a roll material of a flexible film of a supplied material, the flexible film may be, for example, a polyimide (PI) film, a cyclo olefin polymer, COP) film or a transparent conductive transfer film (TCTF), and the flexible film of the supplied material may be coated with a hard coating (HC) layer and an index margin IM) layer. First, the flexible film is attached to the transparent substrate via an optically clear adhesive (OCA) layer, and the flexible film attached to the transparent substrate is taken as the flexible base layer. That is, the roll to sheet process is used to form the flexible base layer. Subsequently, the first ITO film layer for manufacturing the touch electrode is formed on the flexible base layer. In order to achieve a low in-plane sheet resistance, a thickness of the formed first ITO film layer is required to be greater than a film thickness threshold, and the film thickness threshold is the minimum thickness for achieving the required in-plane ITO sheet resistance.

In a practical application, during verifying processes for forming the first ITO film layer, two kinds of ITO target materials respectively with indium-tin ratios of 90:10 and 93:7 are used and a low-temperature coating process was adopted as much as possible, it is found that: first, the ITO target material with the indium-tin ratio of 93:7 may cause cracking of the flexible film layer after crystallization at 130 degree Celsius; second, the ITO film layer formed by the ITO target material with an indium-tin ratio of 93:7 is slightly worse in an optical effect than the ITO film layer formed by the ITO target with an indium-tin ratio of 90:10. Therefore, in the embodiments of the present disclosure, an ITO coating process may be performed, on the flexible base layer formed by the Roll to Sheet process, using the ITO target material with the indium-tin ratio of 90:10. Subsequently, a patterning process is performed on the formed first ITO film layer, i.e. the touch electrode (i.e. ITO electrode) of the flexible touch panel is formed by glue coating, exposure, development, etching and other processes. Based on the thickness of the formed first ITO film layer, the touch electrode obtained after the patterning process can meet the process requirements of low in-plane ITO sheet resistance. In some embodiments of the present disclosure, the thickness of the first ITO film layer formed in step S110 may be in a range of 1200 angstroms (Å) to 1500 angstroms, it is proved through a large number of tests that the thickness range can meet the requirement of ITO sheet resistance of 30 ohms per square to 40 ohms per square.

Compared with the related technologies, the method for manufacturing the flexible touch panel according to the embodiments of the present disclosure has following differences. First, ITO coating manners are different. In the related technologies, the Roll to Roll process is used to perform ITO coating on the flexible film. For example, a COP-ITO film refers to processing of a film layer (including implementing an ITO coating process, etc.) on a COP raw material. Due to limitation by apparatus and roll to roll process, ITO cracks are easily generated during roll winding after the Roll to Roll coating. According to the embodiments of the present disclosure, a Roll to Sheet process is performed such that a roll material is cut into a sheet material, a size of the sheet material (i.e., a flexible film) is matched with a size of a carrier (i.e., a transparent substrate), that is, after the flexible film (e.g., a film layer such as COP film) is attached to the transparent substrate, subsequent processes such as an ITO coating process and the like are performed, in this way, cracks are not easily generated in the ITO coating. Second, based on the difference of the above processes, a thickness of an ITO film layer formed by the related technologies is usually in a range of 500 angstroms to 600 angstroms, and a thickness of the ITO film layer formed by the method provided by the embodiments of the present disclosure may be in a range of 1200 angstroms to 1500 angstroms. Based on the thicknesses of the ITO film layers, a sheet resistance of the ITO electrode formed by the related technologies can reach 70 ohms per square at the lowest, and a sheet resistance of the ITO electrode formed by the method provided by the embodiments of the present disclosure can reach in a range of 30 ohms per square to 40 ohms per square.

In the method for manufacturing the flexible touch panel provided by the embodiments of the present disclosure, the first ITO film layer is formed on the flexible base layer, and the patterning process is performed on the first ITO film to form the touch electrode of the flexible touch panel. Further, since the flexible base layer is attached to the transparent substrate using the Roll to Sheet process, a relatively thick ITO film can be formed when an ITO coating process is performed, thus an ITO electrode (i.e. the touch electrode) with in-plane sheet resistance meeting the requirements is formed. The flexible touch panel manufactured by the manufacturing method provided by the present disclosure solves the problem that the ITO coating manner of adopting the related technologies is difficult to meet the requirements of a low sheet resistance for a narrow-border flexible touch panel due to the limitation of the process and the apparatus therefor. Furthermore, for the flexible touch panel manufactured by adopting the manufacturing method provided by the embodiments of the present disclosure, an ITO electrode with the lowest in-plane sheet resistance is obtained, therefore, a power consumption of the display device distributed on the ITO electrode is lower, and a better effect is exhibited on charging time and a touch sensitivity of the display device.

Figure 2:
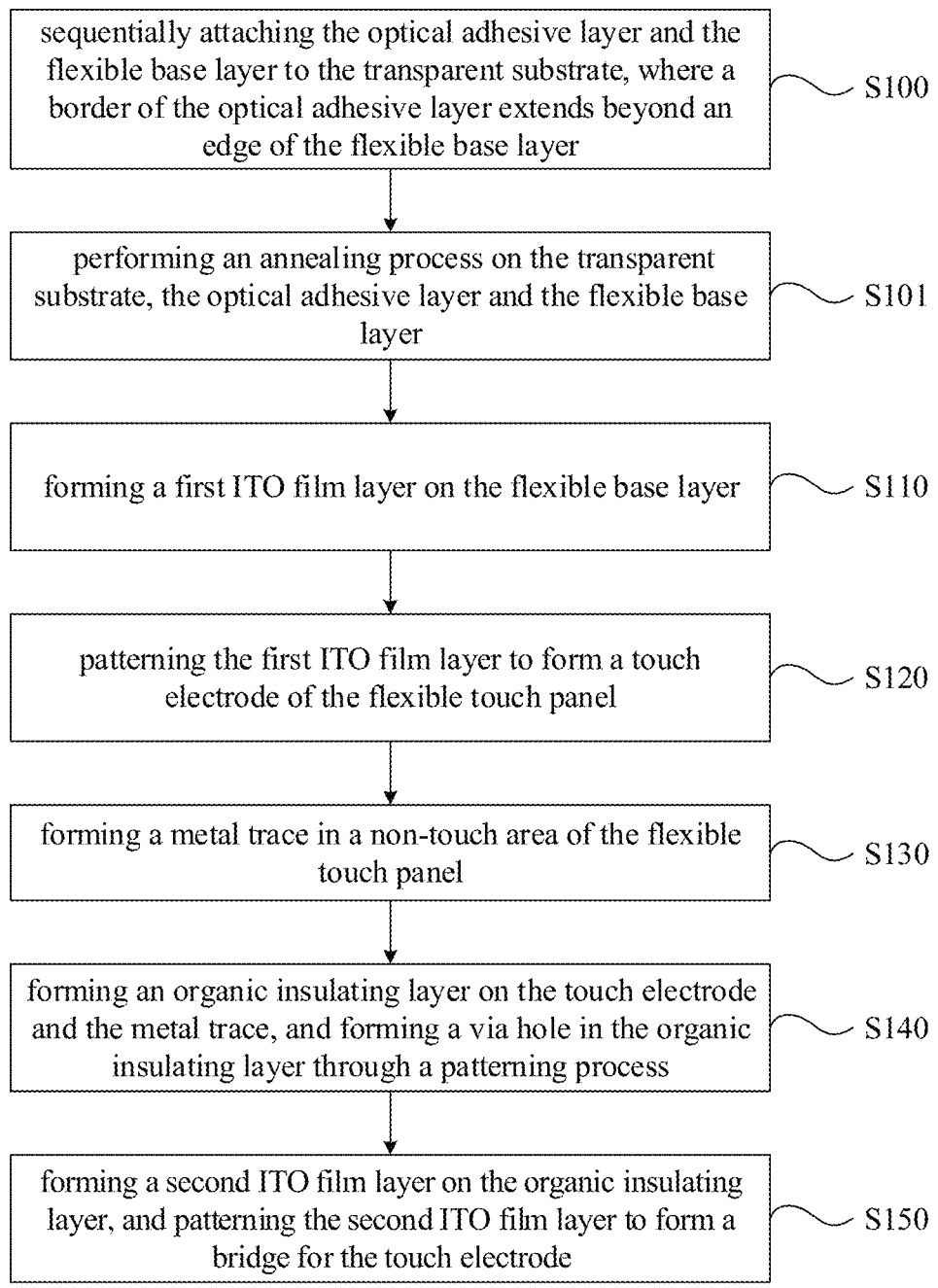
FIG. 2 is a flowchart of a method for manufacturing a flexible touch panel according to some other embodiments of the present disclosure.

FIG. 2 is a flowchart of a method for a manufacturing a flexible touch panel according to some other embodiments of the present disclosure. Based on the embodiment shown in FIG. 1, before step S110, the method according to the embodiments of the present disclosure may further include:

Step S100, sequentially attaching the optical adhesive layer and the flexible base layer to the transparent substrate, where a border of the optical adhesive layer extends beyond an edge of the flexible base layer; and Step S101, performing an annealing process on the transparent substrate, the optical adhesive layer and the flexible base layer.

In the embodiments of the present disclosure, a roll material of a supplied material is a flexible film (i.e., the flexible base layer), on which an HC layer and an IM layer have been formed and an ITO coating process has not been performed, and the flexible film is cut into a sheet material with a roll cutting process. The OCA is attached to the transparent substrate with a laminating (Lami) process and then the flexible base layer (i.e., the above-mentioned flexible film with the HC layer and the IM layer) is attached to the OCA. In addition, in order to improve a stability of the OCA layer and the flexible base layer on the transparent substrate and thus improve yield of mass production in subsequent process of production, an annealing process may be performed on the transparent substrate, and the OCA layer and the flexible base layer attached on the transparent substrate.

Figure 3:
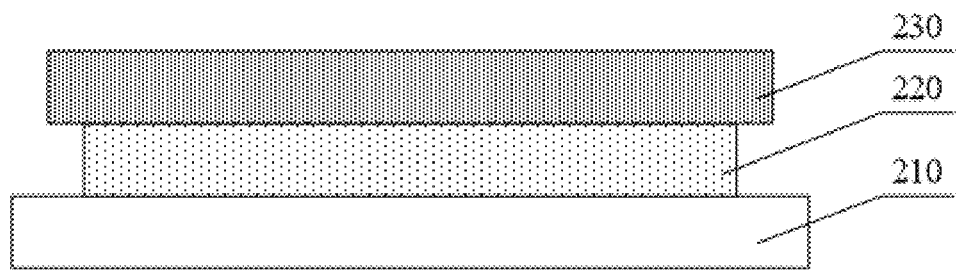
FIG. 3 is a sectional view of a flexible touch panel in related technologies.
Figure 4:
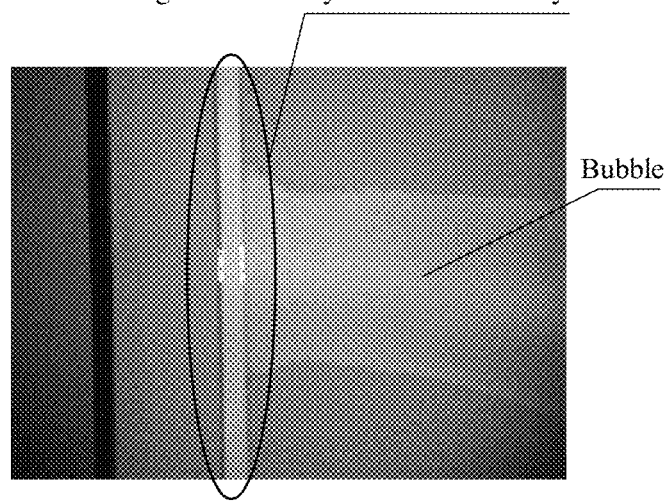
FIG. 4 is a schematic diagram of an edge bubble generated after performing an annealing process on the flexible touch panel in the related technologies shown in FIG. 3.

Taking a COP film as the flexible film as an example, the Lami process in related technologies is described. In the related technologies, when an OCA is attached to a transparent substrate and then a COP film is attached to the OCA, in order to ensure a photo resist coating process, it is usually required that a size of the COP film is larger than a size of OCA temperature control glue. Reference is made to FIG. 3, which is a sectional view of a flexible touch panel in the related technologies, illustrating a transparent substrate 210, an OCA layer 220 and a COP layer 230. It can be seen that the COP layer 230 extends beyond the OCA layer 220. Mainly due to acid-resistant but not alkali-resistant characteristic of the OCA glue, the OCA layer may fall off onto the COP film after using a PR developer (generally alkaline liquid). As the OCA layer falls off after the PR process, the coating of PR glue and foreign matter detection by the exposure machine cannot be successfully performed in the next process, thus process yield of large plates is affected. In addition, if an annealing process is added after the OCA layer 220 and the COP layer 230 are attached with an attachment manner of the related technologies, due to the difference between a film shrinkage at the edge of the COP layer 230, and a thermal expansion and a film shrinkage at a contact position between the COP layer 230 and the OCA layer 220, a large strip-shaped edge bubble will appear at the edge of the OCA layer 220 and the COP layer 230, which cannot meet the requirements of mass production and subsequent processes. Reference is made to FIG. 4, which is a schematic diagram of an edge bubble occurring after performing the annealing process on the flexible touch panel in the related technologies shown in FIG. 3.

Figure 5:
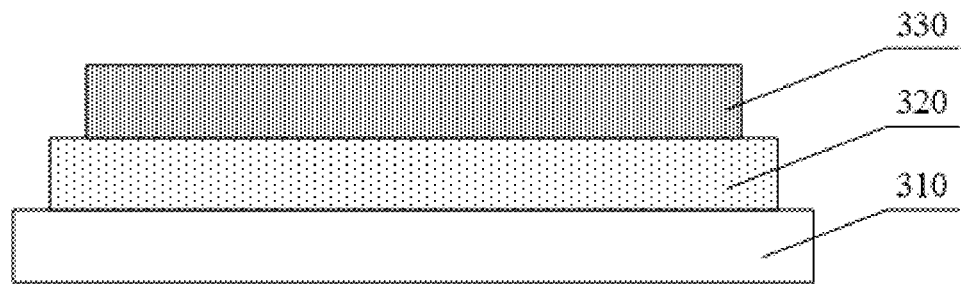
FIG. 5 is a sectional view of a flexible touch panel according to some embodiments of the present disclosure.
Figure 6:
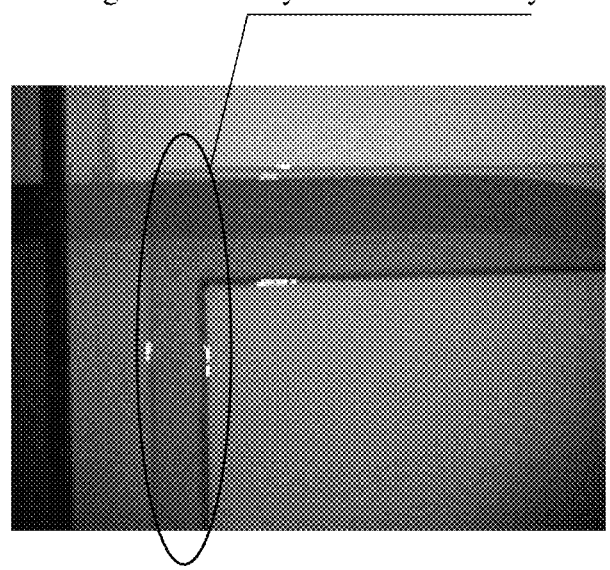
FIG. 6 is a schematic diagram of the flexible touch panel according to some embodiments of the present disclosure shown in FIG. 5 after annealing process.

Different from the related technologies, in the embodiments of the present disclosure, when attaching the flexible base layer, the border of the OCA layer is arranged to extend beyond the edge of the flexible base layer. Reference is made to FIG. 5, which is a sectional view of a flexible touch panel according to some embodiments of the present disclosure, in which the flexible film is also a COP film. A transparent substrate 310, an OCA layer 320 and a COP layer 330 are schematically shown in the drawing. It can be seen that the OCA layer 320 extends beyond the COP layer 330 in the embodiments of the present disclosure. Considering that a cutting accuracy of the COP film layer is generally 0.3 millimeters and an attaching accuracy thereof is generally 0.5 millimeters, the border of the OCA layer 320 may extend beyond the edge of the COP layer 330 by 1 millimeter to 2 millimeters. Through verification, no strip-shaped edge bubble is generated after an annealing process when the COP layer 330 is arranged to be retracted with respect to the OCA layer. Reference is made to FIG. 6, which is a schematic diagram of the flexible touch panel provided by the embodiments of the present disclosure shown in FIG. 5 after performing the annealing process.

It should be noted that, with the method provided in the embodiments of the present disclosure, after the OCA layer 320 and the flexible base layer 330 are attached to the transparent substrate 310, the OCA layer 320 may be exposed, leading separating of the edge of the OCA layer 320 or folding of the edge of the OCA layer 320 onto the COP layer 330, and thus affecting operation of PR coating apparatus and yield of process. In view of the above, embodiments of the present disclosure provide a solution, i.e., optimizing the process manner of manufacturing the touch electrode after the ITO coating process is completed on the flexible base layer.

In some embodiments of the present disclosure, step S120 may be implemented as follows:

performing a glue coating process, an exposure process, a development process and an etching process on the first ITO film layer, where a periphery of the first ITO film layer is shielded by a shutter of an exposure machine during the exposure process, so that an ITO film of the first ITO film layer covering a periphery of the flexible base layer is retained after the etching process.

Figure 7:
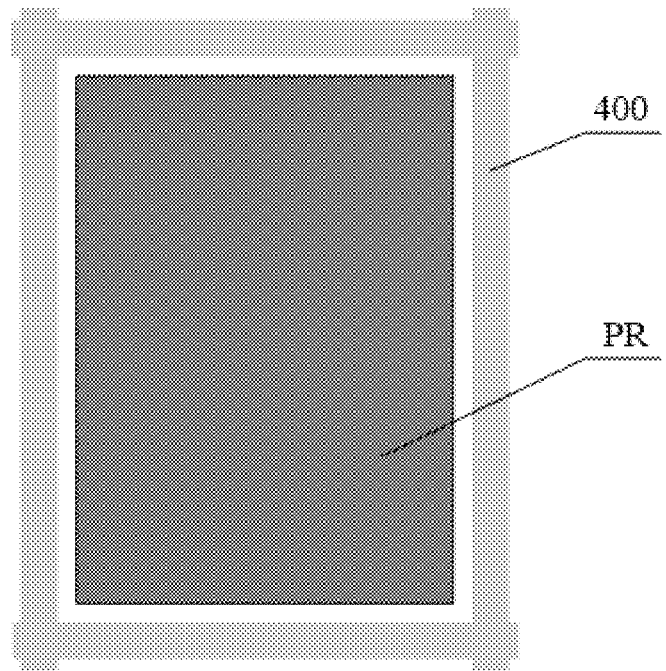
FIG. 7 is a schematic positional diagram of a shutter of an exposure machine when a first ITO film layer is exposed according to a method in the related technologies.
Figure 8:
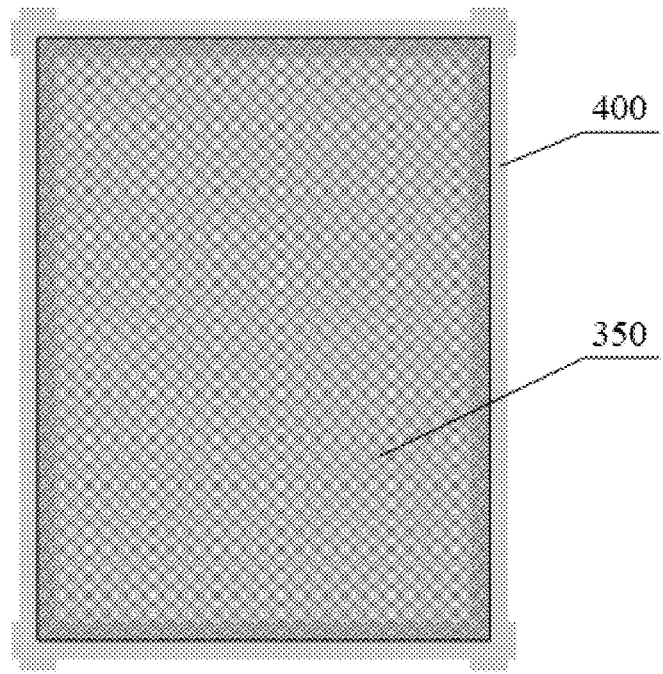
FIG. 8 is a schematic positional diagram of a shutter of an exposure machine when a first ITO film layer is exposed according to a method provided in some embodiments of the present disclosure.
Figure 9:
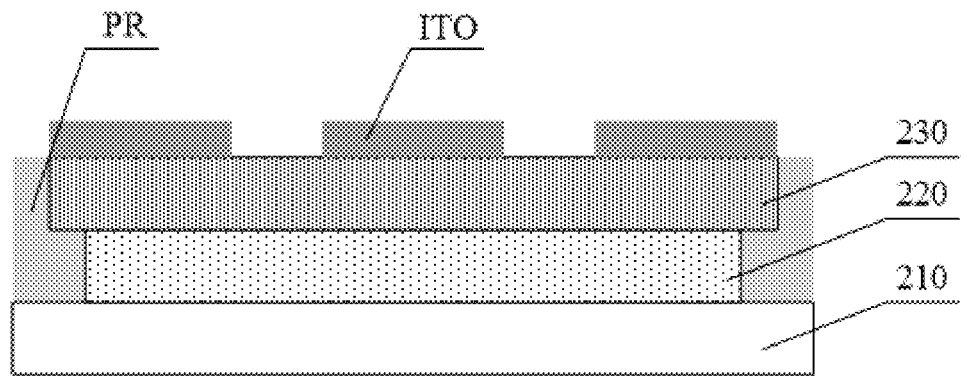
FIG. 9 is a sectional view of a flexible touch panel formed with an exposure manner in the related technologies shown in FIG. 7.
Figure 10:
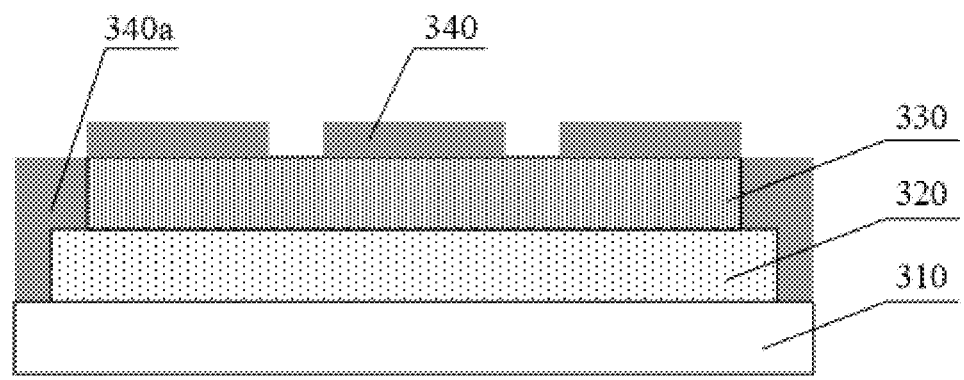
FIG. 10 is a sectional view of a flexible touch panel formed with an exposure manner shown in FIG. 8.

During the process of patterning the first ITO film layer in the embodiments of the present disclosure, processes such as a glue coating process, an exposure process, a development process, an etching process and the like are usually performed. FIG. 7 is a schematic positional diagram of a shutter of an exposure machine when a first ITO film layer is exposed with a method in the related technologies. FIG. 8 is a schematic positional diagram of a shutter of an exposure machine when the first ITO film layer is exposed with a method provided in the embodiments of the present disclosure. FIG. 9 is a sectional view of a flexible touch panel formed with an exposure manner in the related technologies shown in FIG. 7. FIG. 10 is a sectional view of a flexible touch panel formed with an exposure manner shown in FIG. 8. It can be seen that, when the exposure process is performed with the method provided by the embodiments of the present disclosure, the shutter 400 of the exposure machine is retracted to shield a PR layer 350 around the first ITO film layer 340, so that the PR layer 350 is not exposed and remains around a substrate (including the COP layer 330, the OCA layer 320 and the transparent substrate 310). Then an ITO film 340a around the substrate is not etched after performing an etching process, thereby achieving a purpose of protecting the OCA layer 320 by the ITO film 340a.

After the forming the touch electrode of the flexible touch panel, the method according to the embodiments of the present disclosure may further include:

Step S130, forming a metal trace in a non-touch area of the flexible touch panel; and Step S140, forming an organic insulating layer on the touch electrode and the metal trace, and forming a via hole in the organic insulating layer through a patterning process.

In the embodiments of the present disclosure, after the touch electrode is manufactured, metal traces of transverse electrodes and longitudinal electrodes may also be manufactured in the non-touch area of the flexible touch panel, and the transverse electrodes and the longitudinal electrodes are connected to a processing chip via the metal traces. In addition, since the touch electrodes made of the first ITO film layer include the transverse electrodes and longitudinal electrodes, some of these electrodes have not been connected after the patterning process of the first ITO film layer is completed, an ITO bridge for connecting the touch electrodes may be manufactured, and the via hole formed in the organic insulating layer (Over Coating, OC) is used to make a bridge point of the bridge. The method according to embodiments of the present disclosure may further include:

Step S150, forming a second ITO film layer on the organic insulating layer, and patterning the second ITO film layer to form a bridge for the touch electrode.

It should be noted that the patterning the second ITO film layer may include:

performing a glue coating process, an exposure process, a development process and an etching process on the second ITO film layer, where the shutter of the exposure machine is arranged away from the periphery of the flexible base layer during the exposure process, so that the ITO film covering the periphery of the flexible base layer is removed during the etching process.

In the embodiments of the present disclosure, after the coating of the second ITO film layer is completed, the bridge may be formed through a patterning process. Corresponding to the patterning process of the first ITO film layer, the shutter of the exposure machine is pulled to an outermost position during the exposure process, i.e., no PR residue is left on the periphery of the second ITO film layer. When etching the second ITO film layer, the ITO film 340a of the first ITO film layer remaining on the edge of the flexible base layer may be etched to achieve the process purpose.

In the embodiments of the present disclosure, in order to prevent the edge of the exposed OCA layer 320 from falling or folding onto the COP layer 330, after the coating of the first ITO film layer is completed, the PR around the COP layer 330 is not exposed by retracting the shutter of the exposure machine during the patterning process, so as to achieve the purpose of protecting the OCA layer 320 from being damaged with utilization of the ITO film 340a. During the patterning process of the second ITO film layer, the shutter of the exposure machine is pulled to the maximum edge for exposure, so as to achieve a purpose of removing the ITO film 340a. In the embodiments of the present disclosure, the edge bubble problem in the related technologies is solved by reasonably utilizing the shutter during the exposure process, and a purpose of improving the process yield is realized.

Figure 11:
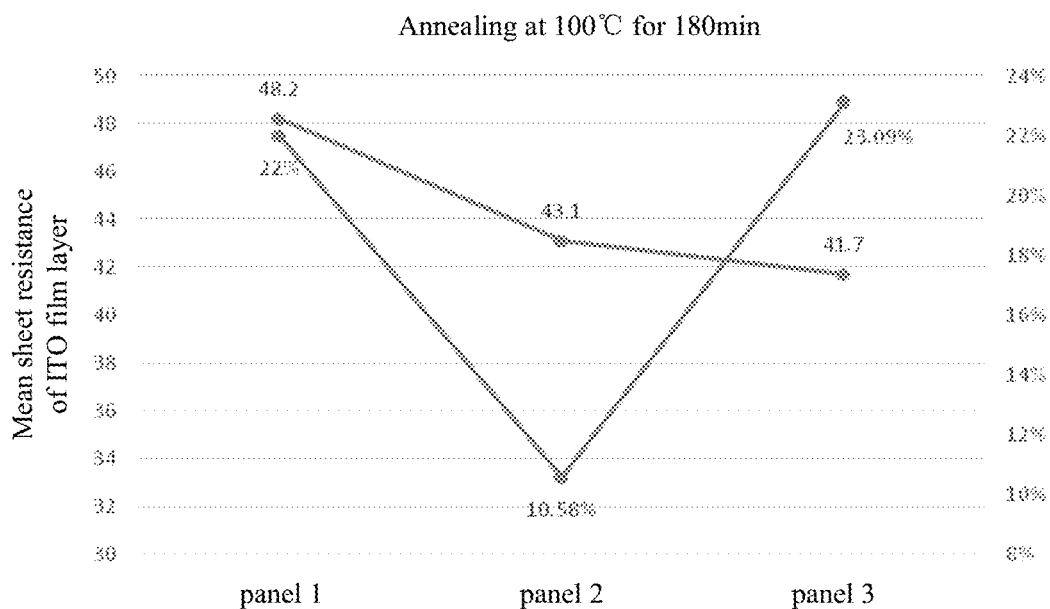
FIG. 11 is a graph of an ITO film layer obtained by ITO film coating after performing an annealing process at 100 degrees Celsius.
Figure 12:
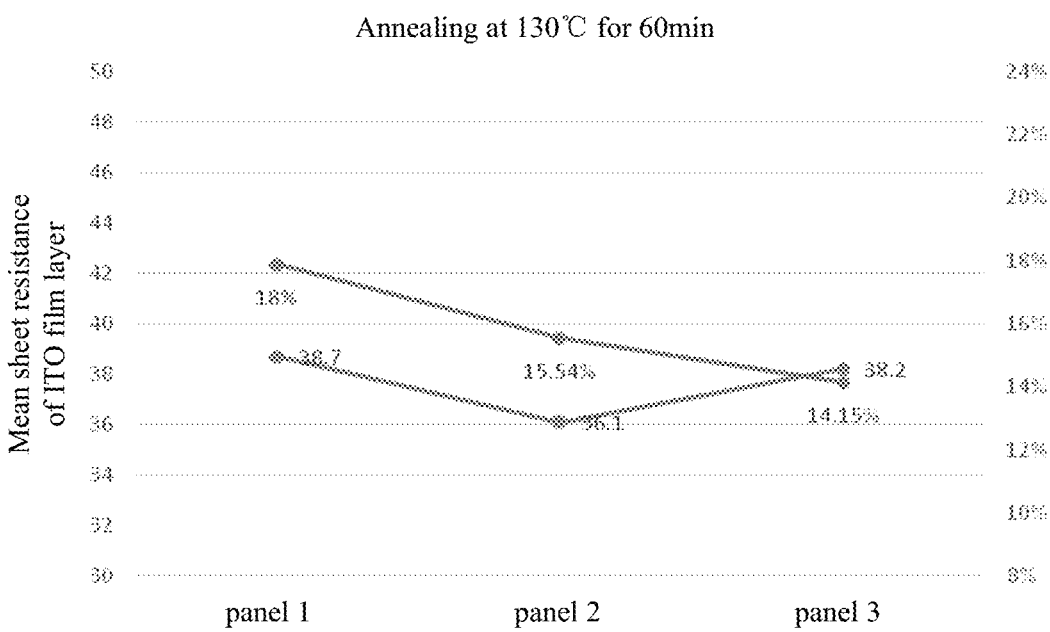
FIG. 12 is a graph of an ITO film layer obtained by ITO film coating after performing an annealing process at 130 degrees Celsius.

In the embodiments of the present disclosure, different annealing temperatures may be selected when performing an annealing process. FIG. 11 is a graph of an ITO film layer obtained by performing an ITO film coating process after an annealing process at 100 degrees Celsius, and FIG. 12 is a graph of an ITO film layer obtained by performing an ITO film coating after an annealing process at 130 degrees Celsius. Reference is made to FIGS. 11 and 12, each of which illustrates a mean sheet resistance and an uniformity of the ITO film layer (e.g. 1350 angstroms) obtained by the ITO film coating after the annealing process, including measured data of ITO films on three flexible touch panels (i.e., panel 1, panel 2 and panel 3). The left ordinate represents mean sheet resistance of ITO film layer, and the right ordinate represents uniformity of ITO film. It can be seen that, a sheet resistance fluctuates greatly in a range of 41 ohms per square to 48 ohms per square and a uniformity of the sheet resistance fluctuates greatly, when annealing at 100 degrees Celsius for 180 minutes (min) is adopted. When the annealing process is performed at 130 degrees Celsius for 60 min, the sheet resistance is stabilized in a range of 36 ohms per square to 38 ohms per square and the uniformity fluctuation of the sheet resistance is small. In addition, since a film material (including the OCA layer and the flexible base layer) on which an annealing process is performed has insufficient heat resistance, a maximum temperature therefor is not more than 140 degrees Celsius. In summary, in the embodiments of the present disclosure, a process temperature is in a range of 130 degrees Celsius to 140 degrees Celsius during performing the annealing process, and a control temperature for a chamber of annealing equipment is less than 130 degrees Celsius.

According to the method for manufacturing the flexible touch panel provided by the embodiments of the present disclosure, the roll to sheet process is used to perform the ITO coating, and after the flexible film is attached and before the ITO coating is performed, the annealing process is added to achieve a stability of the process. Further, the ITO coating with a certain thickness can be achieved during performing a low-temperature ITO coating so as to realize a low sheet resistance ITO. In addition, through changing a size relationship between the OCA layer and the flexible film layer in the related technologies, the OCA layer is arranged to be extended beyond the flexible film layer, and a position of the shutter during an exposure process is adjusted accordingly, which achieves a design solution of improving a product performance and yield, not only reducing the in-plane ITO sheet resistance of the flexible touch panel, but also improving touch sensitivity and reducing energy consumption.

Based on the method for manufacturing the flexible touch panel provided by the above embodiments of the present disclosure, embodiments of the present disclosure further provide a flexible touch panel, which is manufactured by the method according to any of the above embodiments of the present disclosure.

Figure 13:
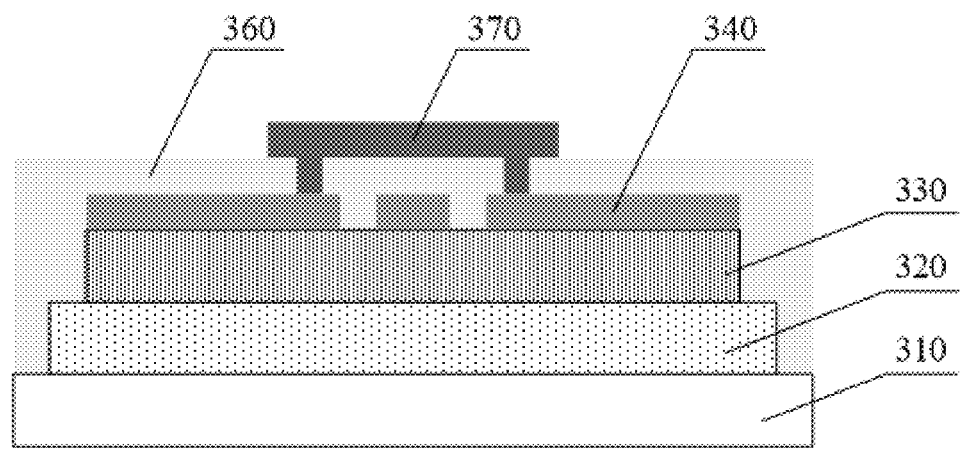
FIG. 13 is a schematic structural diagram of a flexible touch panel according to some embodiments of the present disclosure.

FIG. 13 is a schematic structural diagram of a flexible touch panel according to some embodiments of the present disclosure. The flexible touch panel 30 provided by the embodiments of the present disclosure may include a transparent substrate 310, an OCA layer 320 and a flexible base layer 330 sequentially arranged on a side of the transparent substrate 310 away from the touch operation surface, and a touch electrode 340 arranged on a side of the flexible base layer 330 away from the transparent substrate 310.

The touch electrode 340 is an ITO film layer with a thickness greater than a film thickness threshold. The flexible base layer 330 is attached to the transparent substrate 310 via the OCA layer 320.

The flexible touch panel 30 provided by the embodiments of the present disclosure can be manufactured by the method shown in FIG. 1, that is, the supplied material of the flexible base layer 330 is a roll material, and an ITO coating process has not been performed on a flexible film roll material of the supplied material. The flexible film may be a PI film, a COP film or a TCTF. The roll material is cut into a sheet material by cutting, and the flexible film is attached to the transparent substrate 310 via the OCA layer 320, and the flexible film attached to the transparent substrate 310 is taken as the flexible base layer 330, i.e., the flexible base layer 330 is formed with the roll to sheet process, instead of the roll to roll process in the related technologies. In addition, in the flexible touch panel 30, a side of the transparent substrate 310 to which film layers are not attached is the touch operation surface.

It should be noted that, in some embodiments of the present disclosure, the flexible touch panel 30 may further include: an organic insulating layer 360 (i.e., OC layer) arranged on a side of the touch electrode 340 away from the flexible base layer 330, and an ITO bridge 370 for connecting the touch electrode 340.

Based on the method for manufacturing the flexible touch panel according to the embodiments of the present disclosure, the flexible base layer 330 is formed with the roll to sheet process, the ITO coating on the flexible base layer 330 can reach a thicker film thickness, for example, greater than a film thickness threshold, and the film thickness threshold is the minimum thickness for achieving the required in-plane ITO sheet resistance. The target material for ITO coating in the embodiments of the present disclosure may be an ITO target material with an indium-tin ratio of 90:10 in the above embodiments, and a thickness of the touch electrode may be in a range of 1200 angstroms to 1500 angstroms. It is proved through a large number of tests that the thickness range can meet the requirement of ITO sheet resistance of 30 ohms per square to 40 ohms per square.

The flexible touch panel provided by the embodiments of the present disclosure is manufactured with the method provided by the above embodiments of the present disclosure. Based on the roll to sheet process of the flexible base layer being attached to the transparent substrate via the optical adhesive layer, the thickness of the touch electrode (ITO electrode) on the side of the flexible base layer away from the touch operation surface is larger than the film thickness threshold. When the thickness threshold is satisfied, the ITO electrode (i.e. the touch electrode) of the flexible touch panel provided by the embodiments of the present disclosure has a low sheet resistance, thereby solving a problem that it is difficult to meet the requirements of narrow border on low sheet resistance when adopting the flexible touch panel in related technologies.

Furthermore, for the flexible touch panel provided by the embodiments of the present disclosure, since the ITO electrode has a characteristic of low sheet resistance, a power consumption of a display device distributed on ITO the electrode is low when the flexible touch panel is applied to the display device, which benefits charging time and touch sensitivity of the display device.

In the flexible touch panel 30 provided by the embodiments of the present disclosure, the border of the OCA layer 320 may extend beyond the edge of the flexible base layer 330 by 1 millimeter to 2 millimeters.

Based on the method provided by the above embodiments of the present disclosure, if the structure in which the flexible base layer 330 is arranged to be extend beyond the OCA layer 320 in the related technologies is adopted, after the annealing process is performed, difference between a film shrinkage at the edge of the flexible base layer, and a thermal expansion and a film shrinkage at the contact position between the flexible base layer and the OCA layer may cause appearing of large strip-shaped edge bubble at the edges of the OCA layer and the COP layer, which does not meet the requirements of mass production and subsequent processes. Therefore, the structure of the flexible touch panel 30 is set as follows: the border of the OCA layer 320 extends beyond the edge of the flexible base layer 330 by 1 millimeter to 2 millimeters.

It should be noted that the process manner and the beneficial effects for realizing the border of the OCA layer 320 extending beyond the edge of the flexible base layer 330 have been described in detail in the above embodiments, which will not be repeated herein.

Based on the flexible touch panel provided in the above embodiments of the present disclosure, embodiments of the present disclosure further provide a flexible touch device, and the flexible touch device includes the flexible touch panel 30 provided in any of the above embodiments of the present disclosure. The flexible touch device may further include a circuit structure in a non-touch area around the flexible touch panel 30, where the non-touch area is a border of the flexible touch device. The flexible touch device may further include a camera, a physical key, a flash, etc.

Unless otherwise defined, any technical or scientific terms used herein shall have the common meaning understood by a person of ordinary skills. Such words as "first" and "second" used in the present disclosure are merely used to distinguish different components rather than to represent any order, number or importance. Such words such as "comprising" or "including" mean that an element or an article preceding the words contains an element or an article or an equivalent thereof after the words, and does not exclude existence of other elements or articles. Such words as "connect" or "connected to" may include electrical connection, direct or indirect, rather than being limited to physical or mechanical connection. Such words as "above", "below", "left" and "right" are merely used to represent relative position relationship, and when an absolute position of an object is changed, the relative position relationship may be changed accordingly.

It can be understood that when an element such as a layer, a film, a region or a substrate is referred to as being "on" or "under" another element, the element may be "directly" on or under the another element, or there may be an intervening element therebetween.

Although the embodiments of the present disclosure are described above, the described embodiments are intended for facilitating understanding of the present disclosure and not to limit the present disclosure. Those skilled in the art can make modifications and changes to forms and details of the implementations without departing from spirit and scope of the present disclosure, and the protection scope of the present disclosure shall be consistent with the scope defined in the appended claims.

What is claimed is:

1. A method for manufacturing a flexible touch panel, comprising:
   forming a first indium tin oxide (ITO) film layer on a flexible base layer attached to a transparent substrate via an optical adhesive layer; and
   patterning the first ITO film layer to form a touch electrode of the flexible touch panel,
   wherein the patterning the first ITO film layer comprises:
   performing a glue coating process, an exposure process, a development process and an etching process on the first ITO film layer, wherein a periphery of the first ITO film layer is shielded by a shutter of an exposure machine during the exposure process, so that an ITO film of the first ITO film layer covering a periphery of the flexible base layer is retained after the etching process.

2. The method for manufacturing the flexible touch panel according to claim 1, wherein before the forming a first indium tin oxide film layer on a flexible base layer, the method further comprises:
   sequentially attaching the optical adhesive layer and the flexible base layer to the transparent substrate, wherein a border of the optical adhesive layer extends beyond an edge of the flexible base layer.

3. The method for manufacturing the flexible touch panel according to claim 2, wherein after the sequentially attaching the optical adhesive layer and the flexible base layer to the transparent substrate, wherein a border of the optical adhesive layer extends beyond an edge of the flexible base layer, the method further comprises:
   performing an annealing process on the transparent substrate, the optical adhesive layer and the flexible base layer.

4. The method for manufacturing the flexible touch panel according to claim 3, wherein a temperature for the annealing process is greater than or equal to 130 degree Celsius and less than or equal to 140 degree Celsius.

5. The method for manufacturing the flexible touch panel according to claim 1, wherein after forming the touch electrode of the flexible touch panel, the method further comprises:
   forming a metal trace in a non-touch area of the flexible touch panel;
   forming an organic insulating layer on the touch electrode and the metal trace, and forming a via hole in the organic insulating layer through a patterning process; and
   forming a second ITO film layer on the organic insulating layer, and patterning the second ITO film layer to form a bridge for the touch electrode.

6. The method for manufacturing the flexible touch panel according to claim 5, wherein the patterning the second ITO film layer comprises:
   performing a glue coating process, an exposure process, a development process and an etching process on the second ITO film layer, wherein the shutter of the exposure machine is arranged away from the periphery of the flexible base layer during the exposure process, so that the ITO film covering the periphery of the flexible base layer is removed during the etching process.

7. The method for manufacturing the flexible touch panel according to claim 1, wherein a thickness of the first ITO film layer is greater than a film thickness threshold, the film thickness threshold is a lowest thickness corresponding to a target in-plane ITO sheet resistance of the flexible touch panel, and the target in-plane ITO sheet resistance is greater than or equal to 30 ohms per square and less than or equal to 40 ohms per square.

8. The manufacturing method of the flexible touch panel according to claim 1, wherein the flexible base layer comprises a flexible film, a hard coating layer, and an index margin layer.

9. The method for manufacturing the flexible touch panel according to claim 1, wherein a thickness of the first ITO film layer is greater than or equal to 1200 angstroms and less than or equal to 1500 angstroms.

10. The method for manufacturing the flexible touch panel according to claim 1, wherein an indium-tin ratio of a target material for forming the first ITO film layer is 90:10.

11. A method for manufacturing a flexible touch panel, comprising:
    forming a first indium tin oxide (ITO) film layer on a flexible base layer attached to a transparent substrate via an optical adhesive layer; and
    patterning the first ITO film layer to form a touch electrode of the flexible touch panel,
    wherein before the forming a first indium tin oxide film layer on a flexible base layer, the method further comprises:
    sequentially attaching the optical adhesive layer and the flexible base layer to the transparent substrate, wherein a border of the optical adhesive layer extends beyond an edge of the flexible base layer,
    wherein the border of the optical adhesive layer extends beyond the edge of the flexible base layer by 1 millimeter to 2 millimeters, inclusively.

12. A flexible touch panel, comprising:
    a transparent substrate;
    an optical adhesive layer and a flexible base layer sequentially arranged on a side of the transparent substrate; and
    a touch electrode arranged on a side of the flexible base layer away from the transparent substrate;
    wherein the touch electrode is an indium tin oxide (ITO) film layer, and the flexible base layer is attached to the transparent substrate via the optical adhesive layer,
    wherein a border of the optical adhesive layer extends beyond an edge of the flexible base layer by 1 millimeter to 2 millimeters, inclusively.

13. The flexible touch panel according to claim 12, wherein a thickness of the ITO film layer is greater than a film thickness threshold, the film thickness threshold is a lowest thickness corresponding to a target in-plane ITO sheet resistance of the flexible touch panel, and the target in-plane ITO sheet resistance is greater than or equal to 30 ohms per square and less than or equal to 40 ohms per square.

14. The flexible touch panel according to claim 12, wherein a thickness of the ITO film layer is greater than or equal to 1200 angstroms and less than or equal to 1500 angstroms.

15. The flexible touch panel according to claim 12, further comprising: an organic insulating layer arranged on a side of the touch electrode away from the flexible base layer, and an ITO bridge for connecting the touch electrode.

16. The flexible touch panel of claim 12, wherein a side of the transparent substrate to which the optical adhesive layer and the flexible base layer are not attached is a touch operation surface.

17. The flexible touch panel according to claim 12, wherein the flexible base layer comprises a flexible film, a hard coating layer, and an index margin layer.

18. A flexible touch device, comprising a flexible touch panel according to claim 12.

\* \* \* \* \*